United States Patent
Kalluri et al.

(10) Patent No.: US 12,166,445 B2
(45) Date of Patent: Dec. 10, 2024

(54) MOTOR DRIVE DIRECT CURRENT LINK VOLTAGE MEASUREMENT RESOLUTION IMPROVEMENT WITH FAULT DETECTION

(71) Applicant: Hamilton Sundstrand Corporation, Charlotte, NC (US)

(72) Inventors: Nageswara Rao Kalluri, Karnataka (IN); Swathika Sreedhar, Tamil Nadu (IN); Mahtab Ahmed, Uttar Pradesh (IN); Raghavendra Ramachandra, Karnataka (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 200 days.

(21) Appl. No.: 17/986,150

(22) Filed: Nov. 14, 2022

(65) Prior Publication Data
US 2024/0097597 A1 Mar. 21, 2024

(30) Foreign Application Priority Data

Sep. 19, 2022 (IN) .............................. 202211053560

(51) Int. Cl.
*H02P 29/00* (2016.01)
*H02P 23/14* (2006.01)

(52) U.S. Cl.
CPC .............. *H02P 29/00* (2013.01); *H02P 23/14* (2013.01)

(58) Field of Classification Search
CPC ................................ H02P 29/00; H02P 23/14
See application file for complete search history.

(56) References Cited

U.S. PATENT DOCUMENTS

| 5,513,058 A | 4/1996 | Hollenbeck |
| 5,936,435 A | 8/1999 | Schwenkel et al. |

(Continued)

FOREIGN PATENT DOCUMENTS

| CN | 110768561 A | 2/2020 |
| CN | 110007126 B | 10/2020 |

(Continued)

OTHER PUBLICATIONS

Search Report issued in European Patent Application No. 23198313.1; Application Filing Date Sep. 19, 2023; Date of Mailing Feb. 12, 2024 (8 pages).

*Primary Examiner* — Said Bouziane
(74) *Attorney, Agent, or Firm* — CANTOR COLBURN LLP

(57) ABSTRACT

A motor drive system includes a MUX circuit, a DC voltage scaling circuit, a fault detection circuit, an ADC, and an FPGA. The MUX circuit selectively establishes a MUX input signal path and a MUX output signal path. The DC voltage scaling circuit measures a DC link voltage. The fault detection circuit receives the output DC link voltage and outputs one of a normal operation signal or a fault signal in response to comparing the DC link voltage to one or both of a U/V reference voltage and an O/V reference voltage. The ADC converts one or more input analog voltages into respective corresponding output digital voltages. The FPGA is in signal communication with the ADC output ($ADC_{OUT}$) and the MUX circuit, and is configured to control the motor drive system based on a comparison between one or more of the output digital voltages.

15 Claims, 2 Drawing Sheets

(56) References Cited

U.S. PATENT DOCUMENTS

| | | | |
|---|---|---|---|
| 6,556,458 B2 | 4/2003 | Ohmura et al. | |
| 7,538,570 B2 | 5/2009 | Pelgrom et al. | |
| 8,823,566 B2 | 9/2014 | Atriss et al. | |
| 9,294,024 B2 | 3/2016 | Ooi | |
| 9,612,998 B2 | 4/2017 | Nelson et al. | |
| 9,899,953 B2 | 2/2018 | Figie | |
| 10,840,696 B2 | 11/2020 | Pearce et al. | |
| 11,404,865 B2 | 8/2022 | Brown et al. | |
| 2018/0069565 A1* | 3/2018 | Sugita | H03M 1/182 |
| 2021/0255651 A1 | 8/2021 | Motz et al. | |

FOREIGN PATENT DOCUMENTS

| | | | |
|---|---|---|---|
| CN | 113765466 A | | 12/2021 |
| CN | 115113094 A | * | 9/2022 |

\* cited by examiner

MOTOR DRIVE DIRECT CURRENT LINK VOLTAGE MEASUREMENT RESOLUTION IMPROVEMENT WITH FAULT DETECTION

CROSS-REFERENCE TO RELATED APPLICATIONS

This application claims the benefit of Indian Application No. 202211053560 filed Sep. 19, 2022, the disclosure of which is incorporated herein by reference in its entirety.

BACKGROUND

The present disclosure relates to motor drive systems, and more particularly, to motor drive system that provides direct current link voltage measurement with improved resolution and fault detection.

Motor drive system typically implement a direct current (DC) that include one or more DC link capacitors to introduce an intermediary buffer between an input power source and an output load that have different instantaneous power, voltages, and frequencies. When operating a motor drive system, whether power by an alternating current (AC) source or a direct current (DC) source, health monitoring of the DC link voltage is very crucial to ensure higher availability of the drive operation. In functional safety applications, for example, a motor drive's undefined behavior can be caused by an undervoltage or overvoltage malfunction.

BRIEF DESCRIPTION

According to a non-limiting embodiment of the present disclosure, a motor drive system includes a MUX circuit, a DC voltage scaling circuit, a fault detection circuit, and ADC, and an FPGA. The MUX circuit selectively establishes a first signal path between a first MUX input and a MUX output and a second signal path between a second MUX input and the MUX output. The DC voltage scaling circuit measures a DC link voltage present on a DC link that is connected across a positive voltage rail and a negative voltage rail. The fault detection circuit receives the output DC link voltage, an under-voltage (U/V) reference voltage, and an over-voltage (O/V) reference voltage, and is configured to output one of a normal operation signal or a fault signal in response to comparing the DC link voltage to one or both of the U/V reference voltage and the O/V reference voltage. The ADC converts one or more input analog voltages into respective corresponding output digital voltages. The FPGA is in signal communication with the ADC output ($ADC_{OUT}$) and the MUX circuit, and is configured to control the motor drive system based on a comparison between one or more of the output digital voltages.

In addition to one or more of the features described herein, or as an alternative, further embodiments of the motor drive system can include a feature, wherein the first MUX input configured to receive a first analog voltage indicative of a first reference voltage ($VREF_{ADC}$), and the a second MUX input configured to receive a second analog voltage indicative of a second reference voltage ($VREF_{U/V}$), and wherein the first signal path delivers the first analog voltage to the MUX output and the second signal path delivers the second analog voltage to the MUX output.

In addition to one or more of the features described herein, or as an alternative, further embodiments of the motor drive system can include a feature, wherein the DC scaling circuit includes a voltage divider circuit comprising a first resistor has a positive terminal configured to establish connection with the positive voltage rail and an first opposing terminal, and a second resistor has a negative terminal configured to establish connection with the negative voltage rail and a second opposing terminal connected to the first opposing terminal of the first resistor to establish a mid-point node. The voltage divider circuit further includes a mid-point terminal configured to output the DC link voltage.

In addition to one or more of the features described herein, or as an alternative, further embodiments of the motor drive system can include a feature, wherein the fault detection circuit comprises a first comparator and a second comparator. The first comparator includes a first input (e.g., a inverting input) in signal communication with the mid-point terminal to receive the DC link voltage and a second input (e.g., a non-inverting input) configured to receive a U/V reference voltage ($VREF_{U/V}$). The second comparator includes a first input (e.g., a inverting input) in signal communication with the mid-point terminal to receive the DC link voltage and a second input (e.g., a non-inverting input) configured to receive an O/V reference voltage ($VREF_{O/V}$).

In addition to one or more of the features described herein, or as an alternative, further embodiments of the motor drive system can include a feature, wherein the first comparator is configured to output the normal operation signal indicative of a normal operation of the DC link in response to the DC link voltage being greater or equal to the U/V reference voltage ($VREF_{U/V}$), and to output the fault signal indicative of an under-voltage fault condition in response to the DC link voltage being less than U/V reference voltage ($VREF_{U/V}$).

In addition to one or more of the features described herein, or as an alternative, further embodiments of the motor drive system can include a feature, wherein the second comparator is configured to output the normal operation signal indicative of the normal operation of the DC link in response to the DC link voltage being less than or equal to the O/V reference voltage ($VREF_{O/V}$, and to output the fault signal indicative of an over-voltage fault condition in response to the DC link voltage being greater than O/V reference voltage ($VREF_{O/V}$).

In addition to one or more of the features described herein, or as an alternative, further embodiments of the motor drive system can include a feature, wherein the ADC includes plurality of ADC inputs and an ADC output ($ADC_{OUT}$). The plurality of voltage inputs includes a reference voltage input (REF) in signal communication with the MUX circuit to receive the first reference voltage ($VREF_{ADC}$) in response to establishing the first signal path and to receive the second reference voltage ($VREF_{U/V}$) in response to establishing the second signal path. A first voltage input (V1) is in signal communication with the mid-point terminal to receive the DC link voltage. A second voltage input (V2) is in signal communication with the second MUX input to receive the second analog voltage indicative of the second reference voltage ($VREF_{U/V}$). A third voltage input (V3) is in signal communication with the second input of the first comparator to receive the U/V reference voltage ($VREF_{U/V}$). A fourth voltage input (V4) is in signal communication with the second input of the second comparator to receive the O/V reference voltage ($VREF_{O/V}$).

In addition to one or more of the features described herein, or as an alternative, further embodiments of the motor drive system can include a feature, wherein a voltage differential (Vd) between the DC link voltage received at the first voltage input (V1) and the second analog voltage received at the second voltage input (V2) defines a normal operating voltage range of the DC link.

In addition to one or more of the features described herein, or as an alternative, further embodiments of the motor drive system can include a feature, wherein the FPGA determines the normal operating condition of the DC link in response to receiving the normal operation signal from the first comparator and the second comparator, determines the under-voltage fault condition of the DC link in response to receiving the fault signal from the first comparator, and determines the over-voltage fault condition of the DC link in response to receiving the fault signal from the second comparator.

In addition to one or more of the features described herein, or as an alternative, further embodiments of the motor drive system can include a feature, wherein the FPGA outputs a switch control signal to control a position of the switch to establish the second signal path in response to determining the normal operation condition.

In addition to one or more of the features described herein, or as an alternative, further embodiments of the motor drive system can include a feature, wherein the FPGA outputs a switch control signal to control a position of the switch to establish the first signal path in response to determining the under-voltage fault condition.

In addition to one or more of the features described herein, or as an alternative, further embodiments of the motor drive system can include a feature, wherein the FPGA outputs a protection control signal to control the motor drive system to initiate protection operations in response to determining the over-voltage fault condition.

In addition to one or more of the features described herein, or as an alternative, further embodiments of the motor drive system can include a feature, wherein the protection operations include disconnecting the DC link from the motor drive system and/or one or more electrical loads connected to the motor drive system.

In addition to one or more of the features described herein, or as an alternative, further embodiments of the motor drive system can include a feature, wherein the FPGA performs a Built-In-Test (BIT) configured to validate one or both of the first input voltage input to the first comparator and the second input voltage input to the second comparator.

According to another non-limiting embodiment, a method of controlling a motor drive system comprises selectively establishing a first signal path between a first multiplexer (MUX) input of a first MUX circuit and a MUX output of the MUX circuit, and selectively establishing a second signal path between a second MUX input and the MUX output. The method further comprises measuring, using a direct current (DC) voltage scaling circuit, a DC link voltage present on a DC link that is connected across a positive voltage rail and a negative voltage rail. The method further comprising delivering to a fault detection circuit the output DC link voltage, an under-voltage (U/V) reference voltage, and an over-voltage (O/V) reference voltage. The method further comprises comparing, using the fault detection circuit, the DC link voltage to one or both of the U/V reference voltage and the O/V reference voltage, and outputting from the fault detection circuit one of a normal operation signal or a fault signal based on the comparison between the DC link voltage and one or both of the U/V reference voltage and the O/V reference voltage. The method further comprises converting, using an analog-to-digital converter (ADC), one or more input analog voltages into respective corresponding output digital voltages. The method further comprises controlling, using a field programmable gate array (FPGA) in signal communication with the ADC output ($ADC_{OUT}$) and the MUX circuit, the motor drive system based on a comparison between one or more of the output digital voltage.

The foregoing features and elements may be combined in various combinations without exclusivity, unless expressly indicated otherwise. Features which are described in the context of separate aspects and embodiments may be used together and/or be interchangeable. Similarly, features described in the context of a single embodiment may also be provided separately or in any suitable subcombination. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

Figure 1:
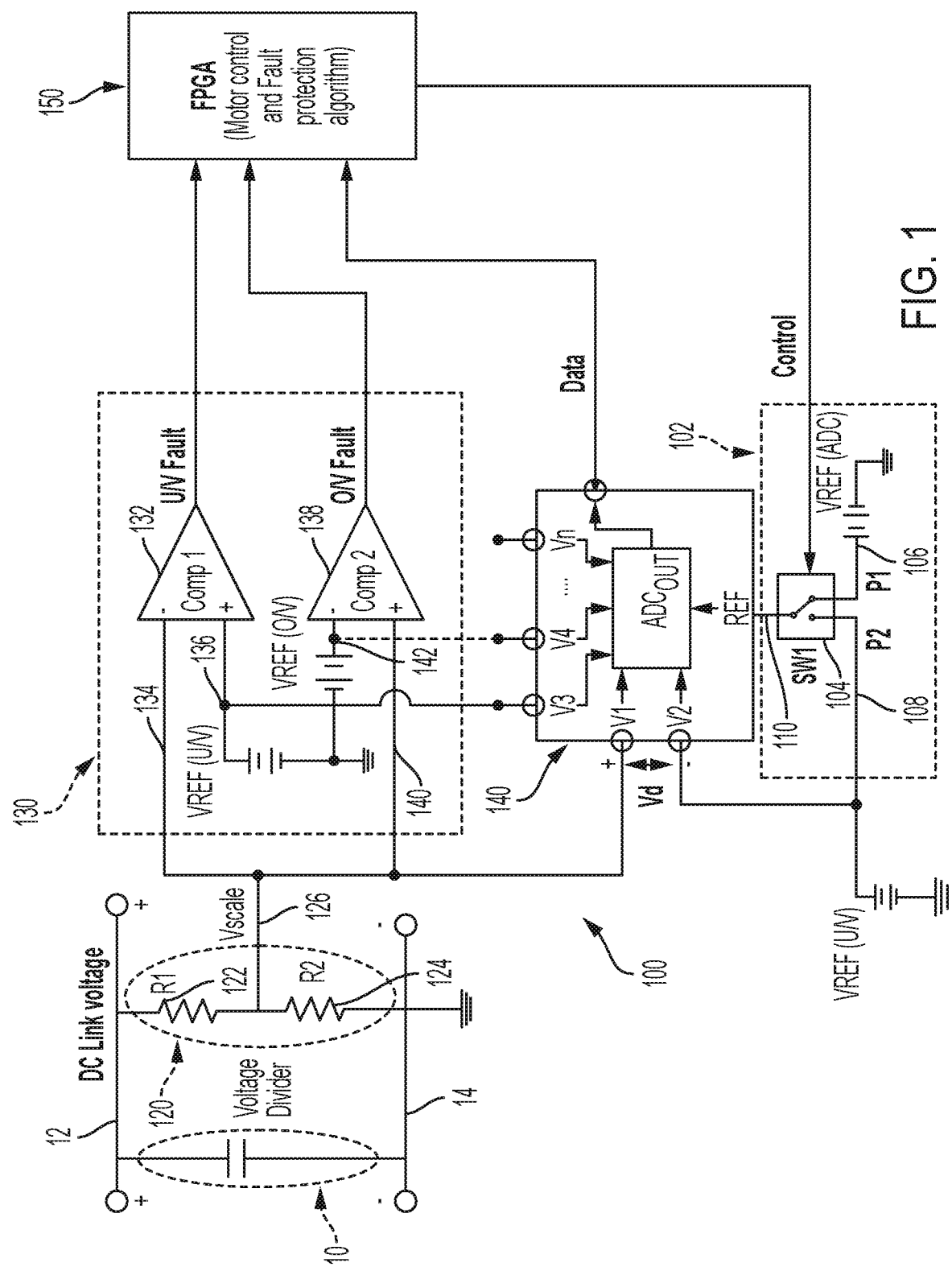
FIG. 1 is a schematic diagram of a motor drive system capable of providing direct current link voltage measurements with improved resolution and fault detection according to a non-limiting embodiment of the present disclosure.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

DETAILED DESCRIPTION

During operation of a motor drive system, it is desirable to avoid unwanted instances of overvoltage (O/V) and undervoltage (U/V). Motor regeneration (often simply referred to as "regeneration"), for example, is one instance that triggers an overvoltage (O/V) condition that can be detected by conventional motor drive systems. A U/V condition may occur when the power source outputs a minimum voltage or a voltage that is less than expected and/or a current inrush limiting event occurs. Conventional motor drive systems, however, are incapable of detecting both the aforementioned O/V and U/V conditions.

Motor drive systems can also selectively operate in different drive operating modes based on various detected operating conditions. The control algorithm used to select and invoke some of these drive operating modes require precise voltage information associated with the DC link bus. Therefore, precise measurements of the DC link bus are necessary are ensure the proper drive operating mode is invoked at that correct time.

Conventional motor drive system utilize a divider circuit that outputs a measurement of the DC link, which is then buffered before being input to an analog-to-digital converter (ADC). The ADC provides an equivalent digital output which can be read by a control device such as Microcontroller, FPGA etc. Based on measured voltages, the control device can invoke a particular drive operating mode and/or perform fault detection such as U/V detection and/or O/V detection.

The conventional motor drive system described above, however, takes into account the output defined by the values of the resistors used to implement the divider circuits. As a result, the conventional motor drive system considers the entire range of DC link voltage rail, which reduces measurement resolution and limits the resolution of the DC link measurement (e.g., to course DC link measurements rather than granular DC link measurements). In addition, the conventional motor drive system described above lacks Built-In-Test (BIT) functionality to take decision on O/V or U/V conditions.

Various non-limiting embodiments of the present disclosure provide a motor drive system capable of providing DC link voltage measurement with improved resolution and fault detection. The motor drive system includes a pair of resistors defining a voltage divider that measures a DC link voltage present on the DC link, and a multiplexer to switch between a first channel and second channel. Selecting between the first channel and the second channel allows for selectively scaling the voltage between a first voltage range (e.g., 0V to 1000V and a second voltage range (e.g., 0V to 5V) to match the ADC input range. The motor drive system further include two comparators to provide U/V and O/V fault detection based on the measured DC link voltage scaled according to the first voltage range and the second voltage range. Accordingly, the motor drive system provides a Built-In-Test (BIT) function to judiciously detect O/V and/or U/V conditions to protect the bus components and dynamically adjust the reference voltage utilized by the ADC to a required value. In one or more non-limiting embodiments, the motor drive system can include a control device (e.g., an FPGA) configured to execute a motor control and fault protection algorithm, and include logic capable of executing decisions to switch between from the first channel to the second channel, or vice versa.

With reference now to FIG. 1, a motor drive system 100 capable of providing direct current link voltage measurements with improved resolution and fault detection according to a non-limiting embodiment of the present disclosure. The motor drive system 100 includes a multiplexer (MUX) circuit 102, a direct current (DC) voltage scaling circuit 120, a fault detection circuit 130, an analog-to-digital converter (ADC) 140, and a field programmable gate array (FPGA) 150.

The MUX circuit 102 includes a switch 104 configured to selectively establish a first signal path between a first MUX input 106 and a MUX output 110, and a second signal path between a second MUX input 108 and the MUX output 110. The first MUX input 106 is configured to receive a first analog voltage indicative of a first reference voltage (VREF$_{ADC}$). The second MUX input 108 is configured to receive a second analog voltage indicative of a second reference voltage (VREF$_{U/V}$). In one or more non-limiting embodiments, the first reference voltage (VREF$_{ADC}$) is set to a high voltage (e.g., about 5V) and the second reference voltage (VREF$_{U/V}$) is set to a low voltage (e.g., about 2V). Accordingly, the first signal path delivers the first analog voltage to the MUX output 110 and the second signal path delivers the second analog voltage to the MUX output 110.

The DC voltage scaling circuit 120 is configured to measure a DC link voltage present on a DC link 10, which is connected across a positive voltage rail 12 and a negative voltage rail 14. According to one or more non-limiting embodiments, the DC scaling circuit 120 is implemented as a voltage divider circuit 120 including a first resistor 122 and a second resistor 124. The first resistor 122 includes a positive terminal configured to establish connection with the positive voltage rail 12, and includes a first opposing terminal connected to a second opposing terminal of the second resistor 124 to establish a mid-point node. The second resistor 124 further includes a negative terminal configured to establish connection with the negative voltage rail 14. The resistors 122 and 124 scale the DC Link voltage range from 0-1000V to 0-5V. The values of the resistors 122 and 124 may be chosen such that the maximum voltage when scaled will be within the input voltage range of the selected ADC 140. The voltage divider circuit 120 further including a mid-point terminal 126 connected to the mid-point node to output the measured DC link voltage.

The fault detection circuit 130 is configured to receive the output DC link voltage, an under-voltage (U/V) reference voltage (VREF$_{U/V}$), and an over-voltage (O/V) reference voltage (VREF$_{O/V}$), and to provide a Built-In-Test (BIT) function to judiciously detect O/V and/or U/V conditions to protect the bus components and dynamically adjust the reference voltage utilized by the ADC 140 to a required value. According to one or more non-limiting embodiments, the fault detection circuit 130 is configured to output one of a normal operation signal or a fault signal in response to comparing the DC link voltage to one or both of the U/V reference voltage (VREF$_{U/V}$) and the O/V reference voltage (VREF$_{O/V}$).

According to one or more non-limiting embodiments, the fault detection circuit 130 includes a first comparator 132 and a second comparator 138. The first comparator 132 includes a first input 134 (e.g., a inverting input) in signal communication with the mid-point terminal 126 to receive a scaled DC link voltage to be measured and a second input 136 (e.g., a non-inverting input) configured to receive the U/V reference voltage (VREF$_{U/V}$). The second comparator 138 includes a first input 140 (e.g., a inverting input) in signal communication with the mid-point terminal 126 to receive the measured DC link voltage and a second input 142 (e.g., a non-inverting input) configured to receive the O/V reference voltage (VREF$_{O/V}$).

During operation of the motor drive system 130, two comparators 132 and 134 can be utilized to perform the BIT function to detect an O/V condition and/or U/V condition. For example, the first comparator 132 is configured to output the normal operation signal indicative of a normal operation of the DC link 10 in response to the measured DC link voltage being greater or equal to the U/V reference voltage (VREF$_{U/V}$), and to output the fault signal indicative of an under-voltage fault condition in response to the DC link voltage being less than U/V reference voltage (VREF$_{U/V}$). Likewise, the second comparator 138 is configured to output the normal operation signal indicative of the normal operation of the DC link 10 in response to the DC link voltage being less than or equal to the O/V reference voltage (VREF$_{O/V}$), and to output the fault signal indicative of an over-voltage fault condition in response to the DC link voltage being greater than O/V reference voltage (VREF$_{O/V}$). The normal operation signals and faults signal are further utilized by the FPGA 150 to control operation of the motor drive system 100 as described in greater detail below.

The ADC 140 is configured to convert one or more input analog voltages into respective corresponding output digital voltages, which can be processed and analyzed by the FPGA 150. The ADC 140 includes a plurality of ADC inputs and an ADC output ($ADC_{OUT}$). In one or more non-limiting embodiments, the ADC inputs include a reference voltage input (REF), a first voltage input (V1), a second voltage input (V2), a third voltage input (V3), and a fourth voltage input (V4).

The reference voltage input (REF) is in signal communication with the MUX circuit 102. Accordingly, the ADC 140 receives the first reference voltage ($VREF_{ADC}$) in response to placing the switch 104 in a first position to establish the first signal path and receives the second reference voltage ($VREF_{U/V}$) in response to placing the switch 104 in a second position to establish the second signal path. The first voltage input (V1) is in signal communication with the mid-point terminal 126 to receive the DC link voltage. The second voltage input (V2) is in signal communication with the second MUX input 108 to receive the second analog voltage indicative of the second reference voltage ($VREF_{U/V}$). The third voltage input (V3) is in signal communication with the second input 136 of the first comparator 132 to receive the U/V reference voltage ($VREF_{U/V}$). The fourth voltage input (V4) is in signal communication with the second input 142 of the second comparator 138 to receive the O/V reference voltage ($VREF_{O/V}$). According to one or more non-limiting embodiments, a voltage differential (Vd) between the DC link voltage received at the first voltage input (V1) and the second analog voltage received at the second voltage input (V2) defines a normal operating voltage range of the DC link 10.

As described, the VREF(U/V) is also connected to V3 channel of ADC, and VREF(O/V) can be connected to V4 channel of ADC 140. Accordingly, the FPGA 150 can determine VREF(U/V), VREF(O/V) and VREF (ADC) voltage levels prior reading actual input voltage output from the first and second comparators 132 and 134. Similarly, before trusting the ADC 140 data, the data can be validated based on the outputs of the first and second comparators 132 and 134. Thus, the system 100 can perform a BIT feature to check and validate the reference voltages, comparators circuitry, validate the operation of the ADC 140 to detect possible overvoltage (O/V) and/or undervoltage (U/V) fault conditions and validate the ADC data before initiating protection operations, while also allow for dynamically switching the reference voltage of ADC 140 to improve the resolution of the measurement range of the interest. In addition, providing the VREF(U/V) to the V3 channel and the VREF(O/V) to the V4 channel allows the FPGA 150 to analyze and validate the first and second input voltages provided to the first and second comparators 132 and 134, respectively, with respect to the outputs delivered from the first and second comparators 132 and 134, which are input to the FPGA 150.

The FPGA 150 is in signal communication with the ADC output ($ADC_{OUT}$) and the MUX circuit 102. The FPGA 150 is configured to store one or more parameters, equations, and/or algorithms which allow the FPGA 150 to actively invoke different motor drive operating modes of the motor drive system 100 based on a comparison between one or more of the output digital voltages and the one or more of algorithms. The parameters can include, for example, a scaling factor for scaling the measured DC link voltage, the value of the first analog reference voltage (VREFADC), the value of the second analog reference voltage (VREFU/V), and the number of bits utilized by the ADC 140. The FPGA 150 can utilize, for example, the following equations:

$$\text{Resolution} = (VREF)/(2^N - 1) \quad \text{EQ. 1}$$

$$\text{Measurement resolution} = (\text{Resolution}) * (\text{Scaling factor}) \quad \text{EQ. 2}$$

In one or more non-limiting embodiments, the FPGA 150 can control motor drive system 100 by controlling the MUX switch 104 to actively adjust or "scale" the resolution of the measured DC link voltage output from the DC voltage scaling circuit 120. The FPGA 150 can also invoke various protection operations in response to determining a fault condition (e.g., an over-voltage fault and/or an under-voltage fault) occurring on the DC link 10. The protection operations include, but are not limited to, disconnecting the DC link 10 from the motor drive system 130 and/or from one or more electrical loads connected to the motor drive system 100.

During operation, for example, the FPGA 150 determines the normal operating condition of the DC link 10 in response to receiving the normal operation signal from the first comparator 132 and the second comparator 138, determines the under-voltage fault condition of the DC link 10 in response to receiving the fault signal from the first comparator 132, and determines the over-voltage fault condition of the DC link 10 in response to receiving the fault signal from the second comparator 138. In response to determining the normal operation condition, the FPGA 150 can output a switch control signal that places the switch 104 into the position which establishes the second signal path 108. In response to determining the under-voltage fault condition, the FPGA 150 can output a switch control signal that places the switch 104 into the position which establishes the first signal path 106. In response to determining the over-voltage fault condition, the FPGA 150 can output a protection control signal, which controls the motor drive system to initiate protection operations as described herein.

Figure 2:
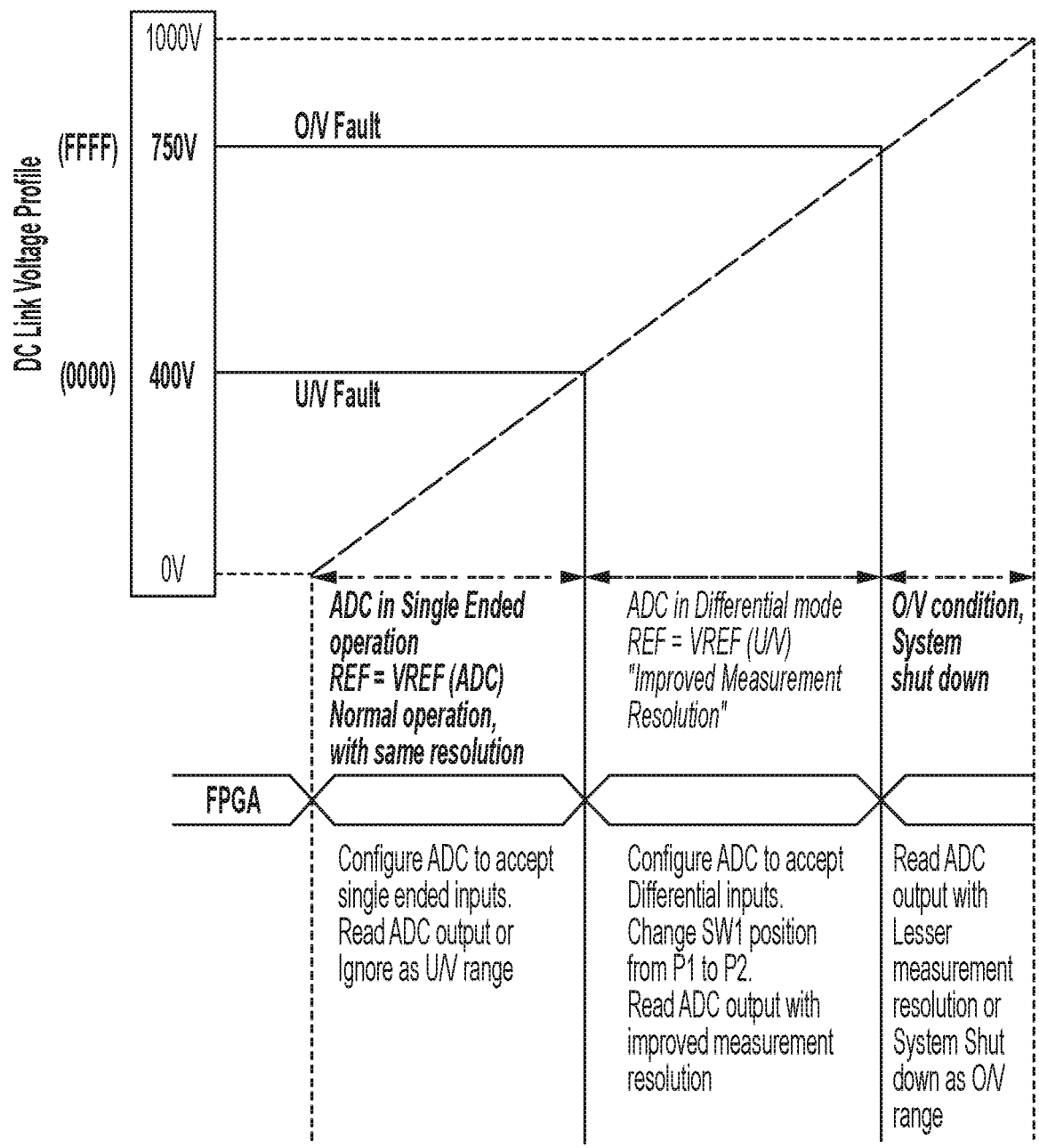
FIG. 2 is a diagram illustrating a DC link voltage profile used to invoke various motor drive operating modes of a motor drive system according to a non-limiting embodiment of the present disclosure.

Turning to FIG. 2, a diagram depicts a DC link voltage profile used to invoke various motor drive operating modes of a motor drive system 100 according to a non-limiting embodiment of the present disclosure. According to the example illustrated in FIG. 2, the DC link voltage profile defines a under-voltage fault condition ranging from 0V to 400V, a normal operation condition ranging from 400V to 750V, and an over-voltage fault condition ranging from 750V to 1000V.

In response to determining the normal operation condition (e.g., from 400V to 750V), the FPGA controls the MUX 102 to establish connection with the second input 108. As a result, the second reference voltage ($VREF_{U/V}$) is input to the reference voltage input (REF) of the ADC 140. Accordingly, the FPGA 150 can utilize the second analog reference voltage (e.g., 2V) to compute a reduced measurement resolution compared to the measurement resolution computed when using the first analog reference voltage (e.g., 5V). The ADC 140 is also configured to accept the DC link voltage at the first input (V1) and the second reference voltage ($VREF_{U/V}$) at the second input (V2).

According to a non-limiting embodiment, the ADC 140 can accept both single-ended and differential signals at the inputs which can be configurable as single-ended or differential inputs by the FPGA 150 interfaced to the ADC 140. The selection can be performed by writing to a control register in the ADC 140 using a data line interfaced to FPGA 150. At the beginning when DC link voltage is below the U/V threshold, the ADC input is configured as single-ended. In response to the DC link voltage exceeding the U/V Fault, the ADC input is configured (e.g., "switched") to a differential input by writing to the control register in the ADC 140 through the data line.

In response to determining the under-voltage fault condition (e.g., from 0V to less than 400V), the FPGA 150 controls the MUX 102 to establish connection with the first input 106. As a result, the first reference voltage (VREF$_{ADC}$) is input to the reference voltage input (REF) of the ADC 140. Accordingly, the FPGA 150 can process the digital voltage output (ADC$_{OUT}$) from the FPGA 150, or disregard the digital voltage because it is output during an on-going under-voltage fault condition.

In response to determining the over-voltage fault condition (e.g., greater than 400V to 750V), the FPGA 150 can process the digital voltage output (ADC$_{OUT}$) from the FPGA 150 with a reduced resolution compared to the resolution of the measured DC link voltage output during normal operation conditions because the first analog reference voltage (VREF$_{ADC}$, e.g., about 5V) is used to compute the measurement resolution. In response to determining the over-voltage condition, the FPGA can also invoke one or more protection operations as described herein.

As described herein, various non-limiting embodiments of the present disclosure provide a motor drive system capable of performing direct current link voltage measurements with fault detection and improved resolution for the entire measured range of the DC link voltage. The fault detection includes Built-In-Test features capable of checking and validating the reference voltage utilized by the fault detection circuit (e.g., the fault detection comparators). The fault detection also includes the capability of detecting an overvoltage (O/V) and/or an undervoltage (U/V) condition appearing on the DC link, which in turn allows the motor drive system to actively switch the reference voltage of ADC and actively adjust the measurement resolution.

The terms "about" and "substantially" are intended to include the degree of error associated with measurement of the particular quantity based upon the equipment available at the time of filing the application. For example, "about" or "substantially" can include a range of ±8% or 5%, or 2% of a given value. The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made, and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure is not limited to the particular embodiment disclosed as the best mode contemplated for carrying out this present disclosure, but that the present disclosure will include all embodiments falling within the scope of the claims.

What is claimed is:

1. A motor drive system comprising:
    a multiplexer (MUX) circuit configured to selectively establish a first signal path between a first MUX input and a MUX output and a second signal path between a second MUX input and the MUX output;
    a direct current (DC) voltage scaling circuit configured to measure a DC link voltage present on a DC link that is connected across a positive voltage rail and a negative voltage rail;
    a fault detection circuit configured to receive the output DC link voltage, an under-voltage (U/V) reference voltage, and an over-voltage (O/V) reference voltage, the fault detection circuit configured to output one of a normal operation signal or a fault signal in response to comparing the DC link voltage to one or both of the U/V reference voltage and the O/V reference voltage;
    an analog-to-digital converter (ADC) configured to convert one or more input analog voltages into respective corresponding output digital voltages; and
    a field programmable gate array (FPGA) in signal communication with the ADC output (ADC$_{OUT}$) and the MUX circuit, the FPGA configured to control the motor drive system based on a comparison between one or more of the output digital voltages.

2. The motor drive system of claim 1, wherein the first MUX input configured to receive a first analog voltage indicative of a first reference voltage (VREF$_{ADC}$), and the a second MUX input configured to receive a second analog voltage indicative of a second reference voltage (VREF$_{U/V}$), and
    wherein the first signal path delivers the first analog voltage to the MUX output and the second signal path delivers the second analog voltage to the MUX output.

3. The motor drive system of claim 1, the DC scaling circuit including a voltage divider circuit comprising a first resistor having a positive terminal configured to establish connection with the positive voltage rail and a first opposing terminal, and a second resistor having a negative terminal configured to establish connection with the negative voltage rail and a second opposing terminal connected to the first opposing terminal of the first resistor to establish a mid-point node, the voltage divider circuit further including a mid-point terminal configured to output the DC link voltage.

4. The motor drive system of claim 1, wherein the fault detection circuit comprising:
    a first comparator including a first input (e.g., an inverting input) in signal communication with the mid-point terminal to receive the DC link voltage and a second input (e.g., a non-inverting input) configured to receive a U/V reference voltage (VREF$_{U/V}$); and
    a second comparator including a first input (e.g., an inverting input) in signal communication with the mid-point terminal to receive the DC link voltage and a second input (e.g., a non-inverting input) configured to receive an O/V reference voltage (VREF$_{O/V}$).

5. The motor drive system of claim 4, wherein the first comparator is configured to output the normal operation signal indicative of a normal operation of the DC link in response to the DC link voltage being greater or equal to the U/V reference voltage (VREF$_{U/V}$), and to output the fault signal indicative of an under-voltage fault condition in response to the DC link voltage being less than U/V reference voltage (VREF$_{U/V}$).

6. The motor drive system of claim 5, wherein the second comparator is configured to output the normal operation signal indicative of the normal operation of the DC link in response to the DC link voltage being less than or equal to the O/V reference voltage (VREF$_{O/V}$), and to output the fault signal indicative of an over-voltage fault condition in response to the DC link voltage being greater than O/V reference voltage (VREF$_{O/V}$).

7. The motor drive system of claim 6, wherein the ADC includes plurality of ADC inputs and an ADC output (ADC$_{OUT}$), the plurality of voltage inputs including:
- a reference voltage input (REF) in signal communication with the MUX circuit to receive the first reference voltage (VREF$_{ADC}$) in response to establishing the first signal path and to receive the second reference voltage (VREF$_{U/V}$) in response to establishing the second signal path;
- a first voltage input (V1) in signal communication with the mid-point terminal to receive the DC link voltage;
- a second voltage input (V2) in signal communication with the second MUX input to receive the second analog voltage indicative of the second reference voltage (VREF$_{U/V}$);
- a third voltage input (V3) in signal communication with the second input of the first comparator to receive the U/V reference voltage (VREF$_{U/V}$); and
- a fourth voltage input (V4) in signal communication with the second input of the second comparator to receive the O/V reference voltage (VREF$_{O/V}$).

8. The motor drive system of claim 7, wherein a voltage differential (Vd) between the DC link voltage received at the first voltage input (V1) and the second analog voltage received at the second voltage input (V2) defines a normal operating voltage range of the DC link.

9. The motor drive system claim 7, wherein the FPGA performs a Built-In-Test (BIT) configured to validate one or both of the first input voltage input to the first comparator and the second input voltage input to the second comparator.

10. The motor drive system of claim 1, wherein the FPGA determines the normal operating condition of the DC link in response to receiving the normal operation signal from the first comparator and the second comparator, determines the under-voltage fault condition of the DC link in response to receiving the fault signal from the first comparator, and determines the over-voltage fault condition of the DC link in response to receiving the fault signal from the second comparator.

11. The motor drive system of claim 10, wherein the FPGA outputs a switch control signal to control a position of the switch to establish the second signal path in response to determining the normal operation condition.

12. The motor drive system of claim 10, wherein the FPGA outputs a switch control signal to control a position of the switch to establish the first signal path in response to determining the under-voltage fault condition.

13. The motor drive system of claim 10, wherein the FPGA outputs a protection control signal to control the motor drive system to initiate protection operations in response to determining the over-voltage fault condition.

14. The motor drive system of claim 13, wherein the protection operations include disconnecting the DC link from the motor drive system and/or one or more electrical loads connected to the motor drive system.

15. A method of controlling a motor drive system, the method comprising:
- selectively establishing a first signal path between a first multiplexer (MUX) input of a first MUX circuit and a MUX output of the MUX circuit;
- selectively establishing a second signal path between a second MUX input and the MUX output;
- measuring, using a direct current (DC) voltage scaling circuit, a DC link voltage present on a DC link that is connected across a positive voltage rail and a negative voltage rail;
- delivering, to a fault detection circuit, the output DC link voltage, an under-voltage (U/V) reference voltage, and an over-voltage (O/V) reference voltage;
- comparing, using the fault detection circuit, the DC link voltage to one or both of the U/V reference voltage and the O/V reference voltage, and outputting from the fault detection circuit one of a normal operation signal or a fault signal based on the comparison between the DC link voltage and one or both of the U/V reference voltage and the O/V reference voltage;
- converting, using an analog-to-digital converter (ADC), one or more input analog voltages into respective corresponding output digital voltages; and
- controlling, using a field programmable gate array (FPGA) in signal communication with the ADC output (ADC$_{OUT}$) and the MUX circuit, the motor drive system based on a comparison between one or more of the output digital voltages.

* * * * *